(12) United States Patent
Sylvestre (10) Patent No.: US 8,939,346 B2
(45) Date of Patent: Jan. 27, 2015

(54) METHODS AND SYSTEMS INVOLVING SOLDERING

(75) Inventor: Julien Sylvestre, Chambly (CA)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 13/027,375

(22) Filed: Feb. 15, 2011

(65) Prior Publication Data

US 2012/0205424 A1    Aug. 16, 2012

(51) Int. Cl.
*B23K 31/02* (2006.01)
*H01L 21/607* (2006.01)
*B23K 1/06* (2006.01)
*B23K 1/00* (2006.01)
*H01L 23/00* (2006.01)

(52) U.S. Cl.
CPC ............. *H01L 24/75* (2013.01); *H01L 24/13* (2013.01); *H01L 24/81* (2013.01); *H01L 2224/75272* (2013.01); *B23K 1/06* (2013.01); *H01L 2224/16227* (2013.01); *H01L 2224/75252* (2013.01); *H01L 2224/75701* (2013.01); *H01L 2224/75841* (2013.01); *H01L 2224/81024* (2013.01); *H01L 2224/75702* (2013.01); *H01L 2224/16225* (2013.01); *B23K 1/0016* (2013.01); *H01L 2224/81169* (2013.01); *H01L 2224/1416* (2013.01); *H01L 24/16* (2013.01); *H01L 2224/75801* (2013.01); *H01L 2224/81193* (2013.01); *H01L 2224/81149* (2013.01); *H01L 2224/759* (2013.01)
USPC .......... 228/110.1; 228/1.1; 228/176; 438/108; 438/612; 438/613

(58) Field of Classification Search
USPC ........ 228/176, 1.1, 110.1; 438/108, 612, 613
See application file for complete search history.

(56) References Cited

U.S. PATENT DOCUMENTS

| 4,831,724 | A  | * | 5/1989  | Elliott      | 29/840   |
|-----------|----|---|---------|--------------|----------|
| 6,202,915 | B1 |   | 3/2001  | Sato         |          |
| 6,299,051 | B1 | * | 10/2001 | Tsujino      | 228/110.1|
| 6,916,687 | B2 |   | 7/2005  | Ho et al.    |          |
| 7,147,735 | B2 | * | 12/2006 | Caskey et al.| 156/73.5 |

(Continued)

FOREIGN PATENT DOCUMENTS

JP     10012669 A     1/1998

OTHER PUBLICATIONS

Nam et al., "Fabrication of a Flip Chip Solder Bump Using a Thin Mold and Ultrasonic Filling," 2007 J. Micromech. Microeng. 17 1863, Abstract only downloaded Jan. 28, 2011, http://iopscience.iop.org/0960-1317/17/9/015/, pp. 1-3.

*Primary Examiner* — Devang R Patel
(74) *Attorney, Agent, or Firm* — Cantor Colburn LLP; Steven Meyers (57) ABSTRACT

A method includes applying solder to conductive pads of a semiconductor device, applying solder to conductive pads of a substrate, aligning the solder on the semiconductor device with the solder on the substrate such that portions of the solder on the semiconductor device contact corresponding portions of the solder on the substrate, heating the semiconductor device and the substrate to liquefy the solder, and exerting an oscillating force operative to oscillate the semiconductor device relative to the substrate at a frequency.

20 Claims, 6 Drawing Sheets

(56) References Cited

U.S. PATENT DOCUMENTS

| | | |
|---|---|---|
| 7,208,410 B2 | 4/2007 | Larson |
| 7,293,567 B2 | 11/2007 | Hertz et al. |
| 7,790,509 B2 | 9/2010 | Gerber |
| 2002/0056740 A1* | 5/2002 | Hayashi .................... 228/110.1 |
| 2002/0056906 A1 | 5/2002 | Kajiwara et al. |
| 2003/0168938 A1* | 9/2003 | Wallaschek et al. .......... 310/328 |
| 2005/0253281 A1 | 11/2005 | Odegard et al. |
| 2006/0043149 A1* | 3/2006 | Matsumura .................... 228/1.1 |
| 2006/0108396 A1* | 5/2006 | Nessman et al. .............. 228/101 |
| 2009/0155955 A1 | 6/2009 | Liang |

* cited by examiner

METHODS AND SYSTEMS INVOLVING SOLDERING

BACKGROUND

The present invention relates to fabricating electronic devices, and more specifically, to methods for making electrical connections in electronic devices.

Electronic devices such as, semiconductor devices often include a number of connective contact regions or pads that are used to power the device and input and output electrical signals. The electronic device may be mounted to a substrate having corresponding pads and conductive connections that facilitate external connections to the device. For example, a semiconductor device may include thousands of input, output, power and ground pads that are arranged in close proximity. The scale and proximity of the pads add complexity to connecting wires or other types of connectors directly to the semiconductor device. A substrate may be fabricated having a corresponding arrangement of pads that are connected to the pads of the semiconductor with conductive solder. The substrate includes conductive lines that connect the pads of the semiconductor device to contact regions that more easily facilitate external connections to the substrate.

BRIEF SUMMARY

According to one embodiment of the present invention, a method includes applying solder to conductive pads of a semiconductor device, applying solder to conductive pads of a substrate, aligning the solder on the semiconductor device with the solder on the substrate such that portions of the solder on the semiconductor device contact corresponding portions of the solder on the substrate, heating the semiconductor device and the substrate to liquefy the solder, and exerting an oscillating force operative to oscillate the semiconductor device relative to the substrate at a frequency.

According to another embodiment of the present invention method includes applying solder to a plurality of conductive pads of a semiconductor device, applying solder to plurality of conductive pads of a substrate, wherein each conductive pad of the plurality of conductive pads of the substrate corresponds to a conductive pad of the plurality of conductive pads of the semiconductor device, aligning the solder on the semiconductor device with the solder on the substrate such that portions of the solder on the semiconductor device contact corresponding portions of the solder on the substrate to form an arrangement of the semiconductor device and the substrate, heating the semiconductor device and the substrate to liquefy the solder forming a conductive bond between at least one of the solder on the semiconductor device and at least one of the solder on the substrate, exerting an oscillating force on the arrangement to result in a relative motion between the semiconductor device and the substrate, and forming a conductive bond between at least one of the solder on the semiconductor device and at least one of the solder on the substrate responsive to exerting the oscillating force.

According to another embodiment of the present invention a system includes a heating device operative to heat a semiconductor device and substrate to a melting point temperature for a solder material formed on the semiconductor device and the substrate, and a vibration device operative to induce an oscillating relative motion between the semiconductor device and the substrate at a frequency while the semiconductor device and the substrate are disposed in the heating device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
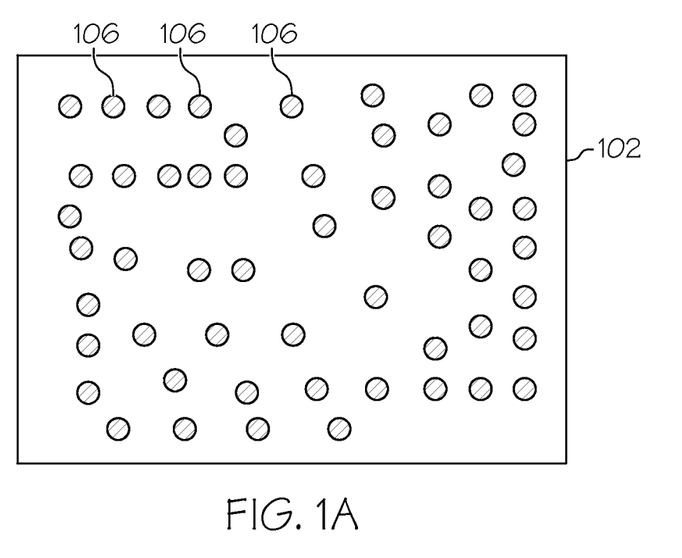
FIG. 1 illustrates top views of a exemplary embodiment of a semiconductor device and a substrate.
Figure 1B:
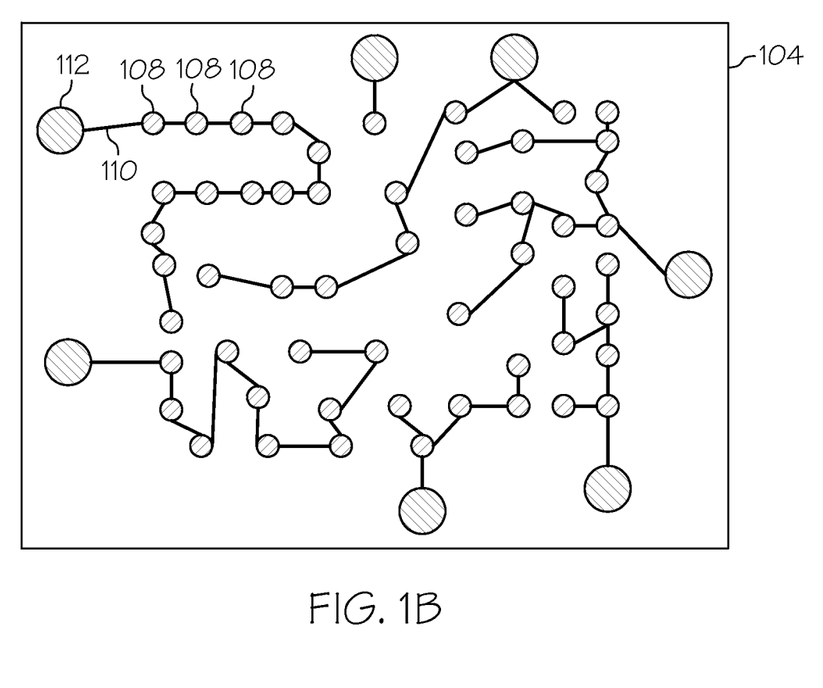

FIG. 1 illustrates top views of an exemplary embodiment of a semiconductor device 102 and a substrate 104. The semiconductor device 102 includes a number of conductive pad regions (not shown) and solder portions 106 that are disposed on the pad regions. The solder portions 106 are formed by disposing a solder material such as, for example, a conductive metallic material onto the pad regions in a liquid state. The solder portions 106 are formed as the solder material cools and solidifies into a generally hemispherical shape (i.e., solder bumps, solder balls, or solder plating). The substrate 104 includes a pattern of pad regions (not shown) and solder portions 108 that are formed in a similar manner as the solder portions 106. The pattern of pad regions (or solder portions 108) of the substrate 104 corresponds to the pattern of solder portions 106 of the semiconductor device 102 such that the semiconductor device 102 and the substrate 104 may be aligned with the solder portions 106 contacting the solder portions 108. The substrate 104 includes a number of conducive interconnect lines 110 that are connected to contact regions 112 for illustrative purposes, the interconnect lines 110 are shown on the top side of the substrate 104 in alternate embodiments, the interconnect lines 110 may be formed on the bottom side of the substrate 104 such that the interconnect lines 110 are formed on a side opposing the colder portions 108. The contact regions 112 allow power and signals to be delivered and received from the semiconductor device 102 via the contact regions of the substrate 104. The substrate 104 may include any type of suitable substrate such as, for example, a ceramic material or a printed circuit board (PCB) type material.

Figure 2:
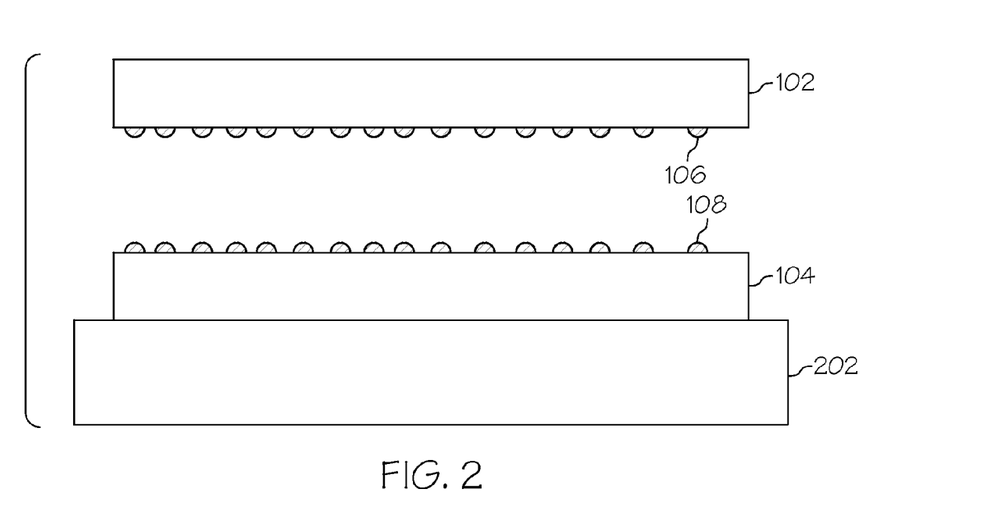
FIG. 2 illustrates a side view of the semiconductor device and the substrate of FIG. 1.

FIG. 2 illustrates a side view of the semiconductor device 102 and the substrate 104. The substrate 104 is disposed on a base member 202 that is operative to support and secure the position of the substrate 104.

Figure 3:
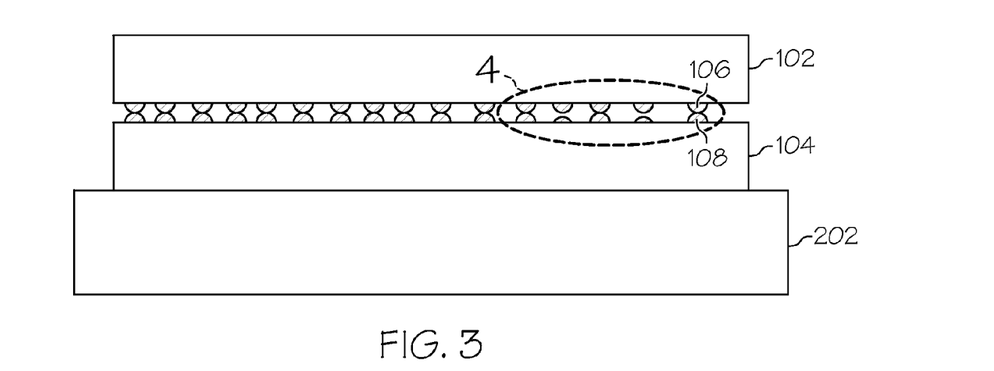
FIG. 3 illustrates a side view of the semiconductor device and the substrate where the semiconductor device has been aligned and disposed on the substrate.
Figure 4:
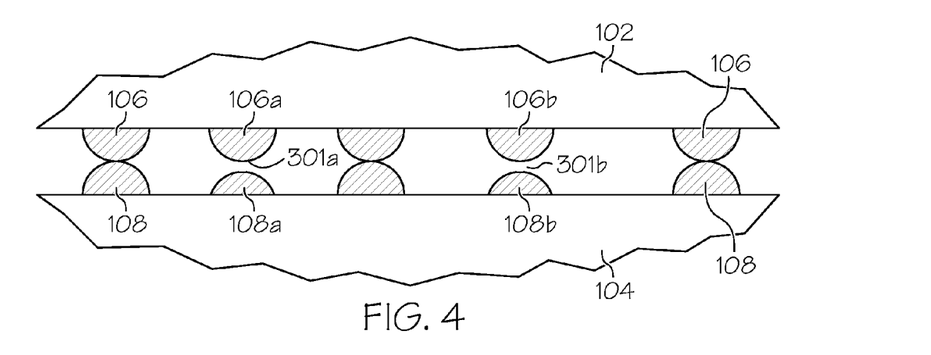
FIG. 4 illustrates a partial view of the region 4 of FIG. 3.

FIG. 3 illustrates a side view of the semiconductor device 102 and the substrate where the semiconductor device 102 has been aligned and disposed on the substrate 104 such that the corresponding solder portions 106 of the semiconductor device 102 contact the solder portions 108 of the substrate 104. Prior to the disposition of the semiconductor device, a flux material may be applied to the solder portions 106 and 108. FIG. 4 illustrates a partial view of the region 4 (of FIG. 3). Referring to FIG. 4, in the illustrated embodiment the majority of corresponding solder portions 106 and 108 are in contact when the semiconductor device 102 is disposed on the substrate 104 however, in some instances, not all of the solder portions 106 may contact the solder portions 108 (e.g. 106a and 108a and 106b and 108b) resulting in gaps 301a and 301b defined by the solder portions 106a and 108a and 106b and 108b respectively. The non-contacting solder portions 106 and 108 may be a result of a variety of factors. For example, the substrate 104 or the semiconductor device 102 may not be uniformly planar, resulting in non-contact. The non-planar shape of the substrate 104 and/or the semiconductor device 102 may be caused by, for example, heating the arrangement resulting in deformation and non-contacting solder portions 106a and 108a. The Other factors may include, for example, slight misalignments of the solder portions 106 or 108 in the fabrication process, or an inconsistent deposition of the volume of the solder material. The non-contacting solder portions 106a and 108a are undesirable and may result in a degradation of the performance of the semiconductor device 102.

Figure 5:
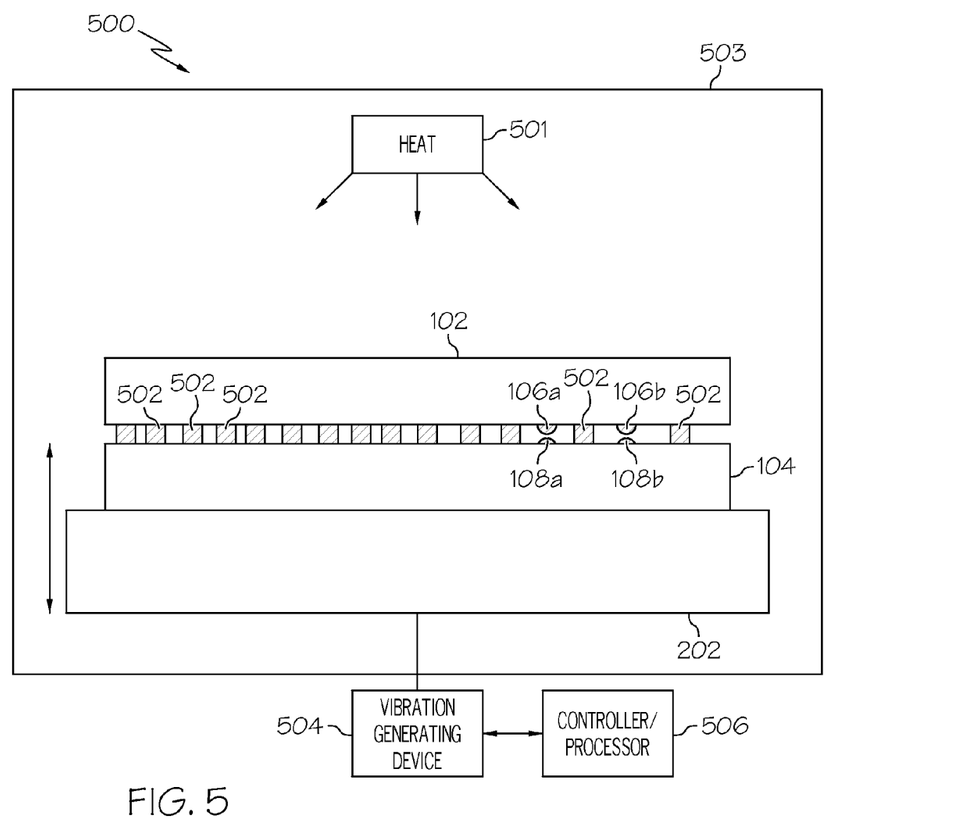
FIG. 5 illustrates an exemplary embodiment of a system.

FIG. 5 illustrates an exemplary embodiment of a system 500 that includes a vibration or oscillation generating device 504, a heat source 501, and an enclosure 503. FIG. 5 illustrates the resultant structure following the heating of the arrangement such that the solder portions 106 and 108 liquefy. The enclosure 503 and heat source 501 may be portions of, for example, an oven or other suitable device. In liquid form, the solder portions 106 and 108 that are in contact connect and combine metallurgically to form conductive portions 502. In the illustrated embodiment, the solder portions 106a, 108a; and 106b, 108b have been liquefied, but have not formed conductive portions because the solder portions 106a, 108a; and 106b, 108b were not in contact when the arrangement was heated.

The vibration generating device 504 may include any device that may cause the arrangement to oscillate at a desired frequency. For example, the vibration generating device 504 may include a piezoelectric oscillator device that is communicatively connected to a controller or processor 506. The piezoelectric oscillator device may be mechanically connected to the base member 202 such that oscillations of the piezoelectric oscillator device impart a force on the base member 202 that oscillates or vibrates the arrangement of the semiconductor device 102 and the substrate 104. Though the illustrated embodiment includes the base member 202, alternate embodiments may include the vibration generating device 504 that is mechanically connected to the substrate 104. Alternatively, the vibration generating device 504 may include a sonic device that may emit sonic pulses or oscillations that are operative to oscillate the arrangement at a desired frequency. Other exemplary embodiments of the vibration generating device 504 may include a radiation emitting device such as, for example, a laser device that may emit an intensity modulated beam that may impart an oscillation on the arrangement.

The vibrations of the assembly impart relative motion between the semiconductor device 102 and the substrate 104. If the magnitude of the relative motion is great enough, the gaps 301a and 302b (of FIG. 4) may be sufficiently reduced to allow contact between liquefied solder portions 106a, 108a; and 106b, 108b respectively resulting in the desired conductive portions 502a and 502b (shown in FIGS. 7 and 8 described below).

Figure 6:
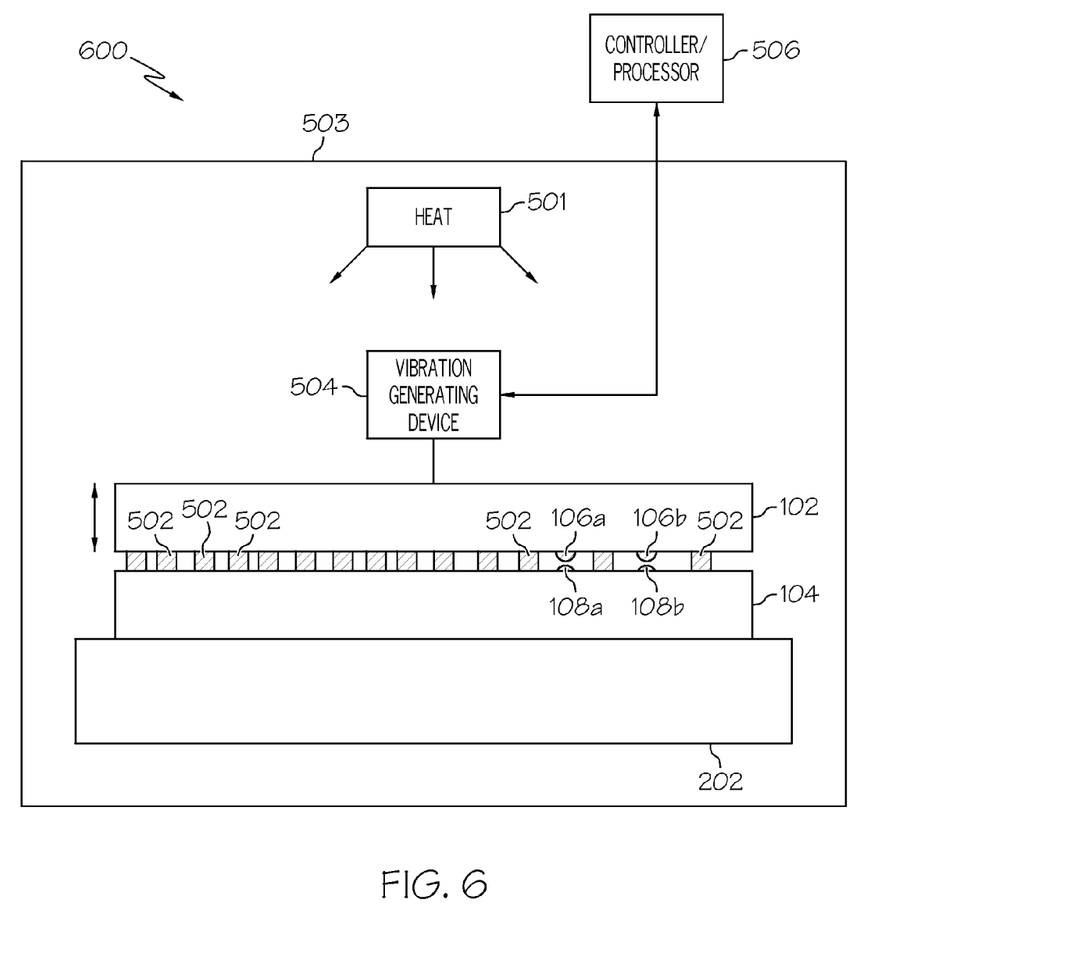
FIG. 6 illustrates an alternate exemplary embodiment of a system.

FIG. 6 illustrates an alternate exemplary embodiment of a system 600 in this regard, the system 600 is similar to the system 500 described above, however the vibration generating device 504 is operative to impart a force on the semiconductor device 102. The force is applied such that the semiconductor device 102 will oscillate following an interruption of the force.

Figure 7:
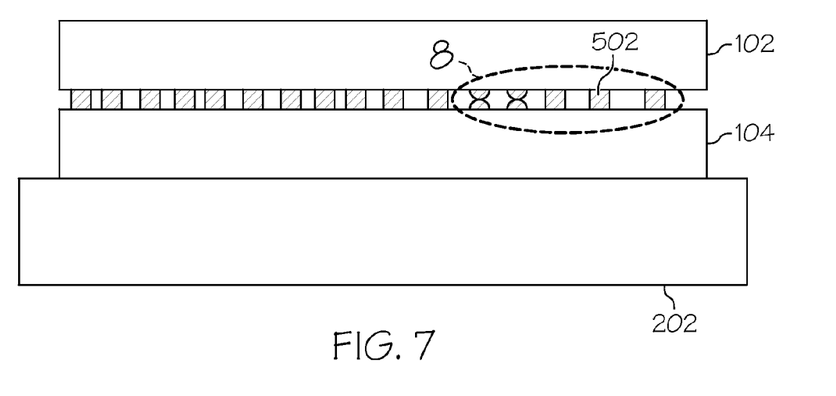
FIG. 7 illustrates a side view of the arrangement of the semiconductor device and the substrate following the oscillation of the arrangement.
Figure 8:
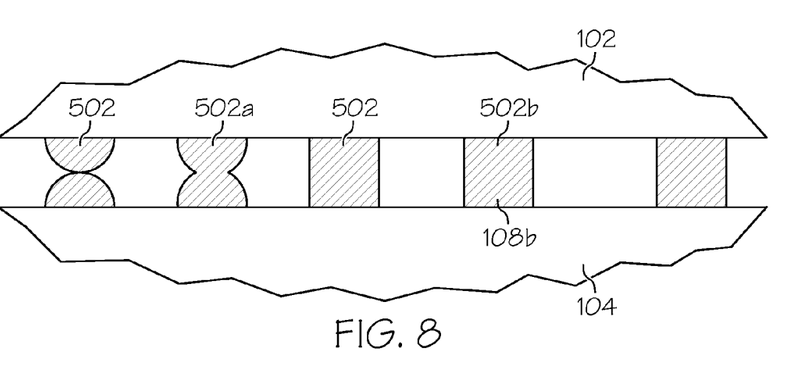
FIG. 8 illustrates a partial view of the region 8 of FIG. 7.

FIG. 7 illustrates a side view of the arrangement of the semiconductor device 102 and the substrate 104 following the oscillation of the arrangement. FIG. 8 illustrates a partial view of the region 8 (of FIG. 7) that includes conductive portions 502a and 502b that have been formed from the contact between liquefied solder portions 106a, 108a; and 106b, 108b during the oscillation process.

To achieve a desired relative motion between the semiconductor device 102 and the substrate 104, the vibration generating device 504 may impart an oscillation on the assembly such that the oscillations are at or near the resonance frequency of the motion of the semiconductor device 102 relative to the substrate, under the restraining effect of the melted solder joins that have properly formed. In this regard, the resonance frequency may be estimated by the equation $((Nk/m)^{1/2})2\pi$; where N is the number of liquefied conductive portions 502 that have formed desired joints (of FIG. 5), k is the spring constant of a liquefied conductive portion 502, and m is the mass of the semiconductor device 102. Once the resonance frequency is estimated, the controller 506 may control the vibration generating device 504 to oscillate at the resonance frequency. In practice, the vibration generating device 504 may oscillate over a band of frequencies (e.g., 900 Hz-950 Hz) to ensure that the resonance frequency is reached while the solder portions 106 and 108 are liquefied. Once the semiconductor device 102 has been vibrated, the assembly may be allowed to cool, solidifying the conductive portions 502.

Figure 9:
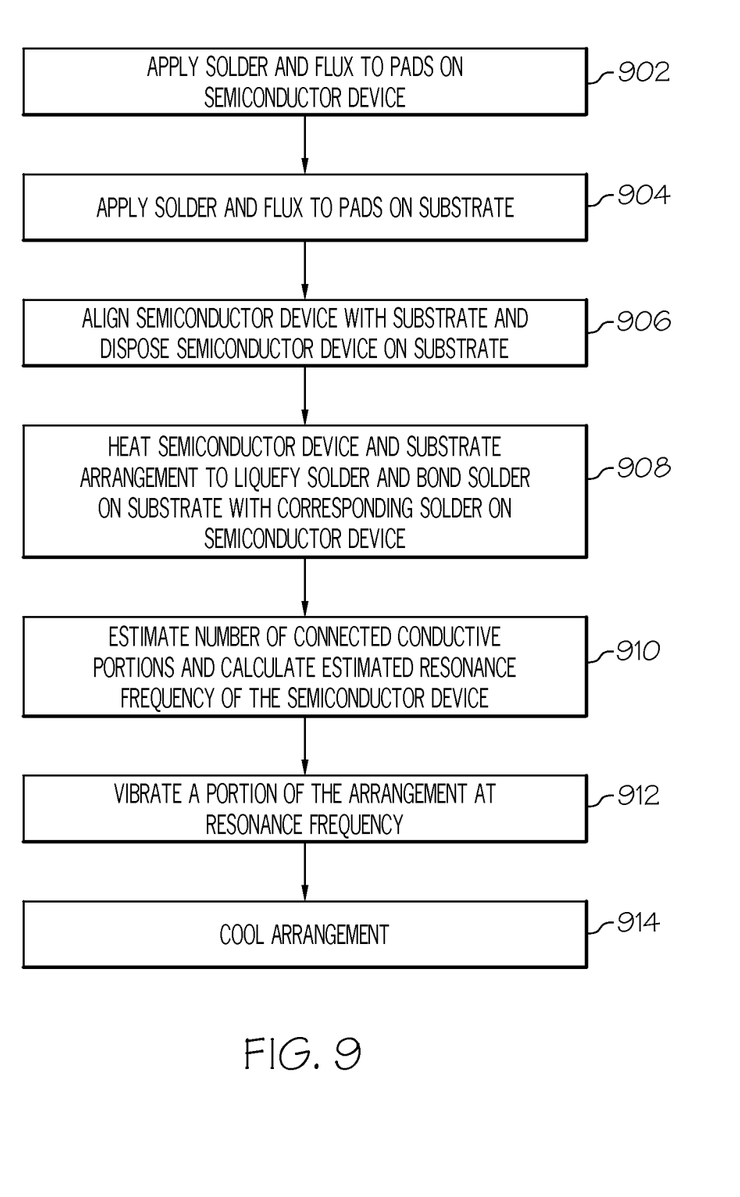
FIG. 9 illustrates a block diagram of an exemplary method.

FIG. 9 illustrates a block diagram of an exemplary method similar to the methods described above. In this regard, in block 902, solder is applied to the conductive pads on a semiconductor device, once the solder is applied, flux may be applied to the solder. Solder is applied to the conductive pads on the substrate in block 904. In block 906, the semiconductor device and the substrate are aligned, and the semiconductor device is disposed on the substrate. In block 908, the semiconductor device and substrate arrangement is heated to liquefy the solder and form conductive portions from solder portions on substrate and corresponding solder portions on semiconductor device. The arrangement may be heated in, for example, an oven, furnace, or other suitable heating device having a heat source. The number of connected conductive portions are estimated, and an estimated resonance frequency of the semiconductor device is calculated in block 910. In block 912, the arrangement is vibrated or oscillated at the estimated resonance frequency or over a band of frequencies that includes the estimated resonance frequency. The arrangement is cooled in block 914 to solidify the solder.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising;
   arranging a planar surface of a semiconductor device and a planar surface of a substrate substantially in parallel such that separate solder portions arranged on conductive pads of the semiconductor device are aligned with corresponding separate solder portions arranged on conductive pads of the substrate, at least one of the separate solder portions arranged on the conductive pads of the substrate and at least one of the separate solder portions arranged on the conductive pads of the semiconductor device defining a gap therebetween, and such that at least another one of the separate solder portions arranged on the conductive pads of the substrate and at least another one of the separate solder portions arranged on the conductive pads of the semiconductor device are in contact with each other;
   heating the arranged semiconductor device and the substrate to liquefy the separate solder portions arranged on the conductive pads of the semiconductor device and the separate solder portions arranged on the conductive pads of the substrate;
   estimating a frequency in accordance with a number of the separate solder portions arranged on conductive pads of the semiconductor device that have liquefied and a mass of the semiconductor device; and
   exerting an oscillating force operative to oscillate the semiconductor device relative to the substrate at the frequency to close the gap between the at least one of the separate solder portions arranged on the conductive pads of the substrate and the at least one of the separate solder portions arranged on a conductive pads of the semiconductor device to form a bond therebetween.

2. The method of claim 1, wherein the method further includes calculating an estimated resonance frequency of the motion of the semiconductor device relative to the substrate.

3. The method of claim 1, wherein the force exerted on the semiconductor device includes an oscillation force over a band of frequencies.

4. The method of claim 3, wherein the band of frequencies includes the resonance frequency of the motion of the semiconductor device relative to the substrate.

5. The method of claim 1, wherein the relative motion between the semiconductor device and the substrate is operative to induce contact between the separate portions of the solder on the semiconductor device and the corresponding separate portions of the solder on the substrate.

6. The method of claim 1, wherein the method further includes cooling the semiconductor device, the substrate, and the solder after exerting the force on the semiconductor device.

7. The method of claim 1, wherein the force is exerted by a piezoelectric device or a sonic device.

8. A method comprising:
   applying solder to a plurality of conductive pads of a semiconductor device;
   applying solder to plurality of conductive pads of a substrate, wherein each conductive pad of the plurality of conductive pads of the substrate corresponds to a conductive pad of the plurality of conductive pads of the semiconductor device;
   aligning the solder on the semiconductor device with the solder on the substrate such that portions of the solder on the semiconductor device contact corresponding portions of the solder on the substrate, wherein a gap is defined between at least one of the portions of the solder arranged on the substrate that is not in contact with any portion of solder arranged on the semiconductor device to form an arrangement of the semiconductor device and the substrate wherein a planar surface of the semiconductor device and a planar surface of the substrate are arranged substantially in parallel;
   heating the semiconductor device and the substrate to liquefy the solder forming a conductive bond between at least one of the solder on the semiconductor device and at least one of the solder on the substrate;
   estimating a resonance frequency in accordance with a number of the portions of the solder on the semiconductor device that have liquefied and a mass of the semiconductor device;
   exerting an oscillating force on the arrangement in accordance with the resonance frequency exerted to result in a relative motion between the semiconductor device and the substrate in a direction that is substantially normal to the planar surface of the semiconductor device following the heating of the semiconductor device and the substrate; and
   forming a conductive bond between the at least one of the portions of the solder arranged on the substrate that was not in contact with any portion of solder arranged on the semiconductor device responsive to exerting the oscillating force.

9. The method of claim 8, wherein the oscillating force is exerted while the semiconductor device and substrate are disposed in a heating device.

10. A method comprising:
    arranging a planar surface of a semiconductor device and a planar surface of a substrate substantially in parallel such that solder portions disposed on respective conductive pads of the semiconductor device are arranged in an alignment with solder portions disposed on respective conductive pads of the substrate and such that at least one of the solder portions disposed on the respective conductive pads of the substrate is in contact with at least one of the solder portions disposed on the respective conductive pads of the semiconductor and such that at least another one of the solder portions disposed on the respective conductive pads of the substrate and at least another one of the solder portions disposed on the respective conductive pads of the semiconductor device define a gap therebetween;

heating the semiconductor device and the substrate while arranged in the alignment to liquefy the solder portions arranged on the conductive pads of the semiconductor device and the solder portions arranged on the conductive pads of the substrate;

estimating a frequency in accordance with a number of the solder portions arranged on conductive pads of the semiconductor device that have liquefied and a mass of the semiconductor device; and exerting an oscillating force following the heating while the semiconductor device and the substrate are arranged in the alignment that is operative to oscillate the semiconductor device relative to the substrate at the frequency to close the gap such that the at least one of the solder portions arranged on the conductive pads of the substrate and the at least one of the solder portions arranged on a conductive pads of the semiconductor device form a bond therebetween.

11. The method of claim 1, wherein the frequency is an estimated resonance frequency of the motion of the semiconductor device relative to the substrate.

12. The method of claim 1, wherein the frequency includes a resonance frequency of the motion of the semiconductor device relative to the substrate.

13. The method of claim 1, wherein the semiconductor device and the substrate are heated in an oven device, and the force exerted on the semiconductor device is exerted while the semiconductor device and the substrate are disposed in the oven device.

14. The method of claim 1, wherein the force exerted on the semiconductor device includes an oscillation force over a band of frequencies estimated in accordance with the number of the solder portions arranged on conductive pads of the semiconductor device that have liquefied and the mass of the semiconductor device.

15. The method of claim 14, wherein the band of frequencies includes the resonance frequency of the motion of the semiconductor device relative to the substrate.

16. The method of claim 1, wherein the relative motion between the semiconductor device and the substrate is operative to induce contact between portions of the solder on the semiconductor device and corresponding portions of the solder on the substrate.

17. The method of claim 1, wherein the separate solder portions arranged on conductive pads of the semiconductor device are separated from each other along the planar surface of the semiconductor device and the separate solder portions arranged on conductive pads of the substrate are separated from each other along the planar surface of the substrate.

18. The method of claim 10, wherein the solder portions disposed on the respective conductive pads of the semiconductor device are separated from each other along the planar surface of the semiconductor device are separated along the planar surface of the substrate from the solder portions disposed on the respective conductive pads of the substrate.

19. The method of claim 1, wherein the estimating of the frequency in accordance with the number of the separate solder portions arranged on conductive pads of the semiconductor device that have liquefied multiplied by a spring constant of the separate solder portions arranged on the conductive pads of the substrate that have liquefied and divided by the mass of the semiconductor device.

20. The method of claim 1, wherein the frequency is estimated to be a resonance frequency over a frequency band of 900 Hz to 950 Hz.

* * * * *